(12) United States Patent
Wang et al.

(10) Patent No.: US 10,290,673 B1
(45) Date of Patent: May 14, 2019

(54) BITLINE SETTLING IMPROVEMENT AND FPN REDUCTION BY FLOATING BITLINE DURING CHARGE TRANSFER

(71) Applicant: OmniVision Technologies, Inc., Santa Clara, CA (US)

(72) Inventors: Rui Wang, San Jose, CA (US); Min Qu, Mountain View, CA (US); Hiroaki Ebihara, San Jose, CA (US); Zhiyong Zhan, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/853,463

(22) Filed: Dec. 22, 2017

(51) Int. Cl.
*H04N 5/222* (2006.01)
*H01L 27/146* (2006.01)
*H04N 5/378* (2011.01)
*H04N 5/235* (2006.01)
*H04N 5/374* (2011.01)

(52) U.S. Cl.
CPC ..... *H01L 27/14643* (2013.01); *H04N 5/2355* (2013.01); *H04N 5/378* (2013.01); *H04N 5/3742* (2013.01)

(58) Field of Classification Search
CPC .................................................. H04N 5/3742
See application file for complete search history.

(56) References Cited

U.S. PATENT DOCUMENTS

| 8,149,304 | B2 * | 4/2012 | Murakami | H04N 5/378 250/208.1 |
| 8,325,255 | B2 * | 12/2012 | Aruga | H04N 5/3598 348/294 |
| 9,549,135 | B2 * | 1/2017 | Kito | H04N 5/378 |
| 2018/0255258 | A1 * | 9/2018 | Shin | A61B 1/04 |

* cited by examiner

Primary Examiner — Gary C Vieaux

(57) ABSTRACT

A photodiode is adapted to accumulate image charges in response to incident light. A transfer transistor is coupled between the photodiode and a floating diffusion to transfer the image charges from the photodiode to the floating diffusion. A transfer gate voltage controls the transmission of the image charges from a transfer receiving terminal of the transfer transistor to the floating diffusion. A reset transistor is coupled to supply a supply voltage to the floating diffusion. A source follower transistor is coupled to receive voltage of the floating diffusion from a gate terminal of the source follower and provide an amplified signal to a source terminal of the source follower. A row select transistor is coupled to enable the amplified signal from the SF source terminal and output the amplified signal to a bitline. A bitline enable transistor is coupled to link between the bitline and a bitline source node. The bitline source node is coupled to a blacksun voltage generator. A current source generator is coupled between the bitline source node and a ground. The current source generator provides adjustable current to the bitline source node through a bias transistor controlled by a bias control voltage.

47 Claims, 4 Drawing Sheets

BITLINE SETTLING IMPROVEMENT AND FPN REDUCTION BY FLOATING BITLINE DURING CHARGE TRANSFER

TECHNICAL FIELD

This disclosure relates generally to Complementary Metal-Oxide-Semiconductor (CMOS) image sensors, and in particular but not exclusively, relates to apparatus and method applied to photodiode pixel cells and their output line (bitline) in image sensor that is capable of fast settling the bitline during the readout of the image signal to reduce fixed pattern noise (FPN) and to maintain stability of the supply power.

BACKGROUND INFORMATION

Image sensors have become ubiquitous. They are widely used in digital still cameras, cellular phones, security cameras, as well as medical, automobile, and other applications. High dynamic range (HDR) image sensors have been required by many of those applications. Human eyes normally possess a dynamic range of up to about 100 dB. For automobile applications, an image sensor of more than 100 dB dynamic range to deal with different driving conditions, such as driving through a dark tunnel into bright sunlight, is often required.

HDR image sensors do not always perform HDR functions properly.

Common drawbacks include image degradation due to fixed pattern noise (FPN), large random noise, reduced resolution associated with charge blooming, motion artifacts, fixed sensitivity, and lower fill factor when multiple photodiodes are used, where fill factor is a ratio of a pixel's light sensitivity area to its total area.

When image sensors are used, photo-generated electrons in each of the plurality of pixel cells are transferred from the photodiode (PD) to the floating diffusion (FD) for subsequent readout. The transfer (TX) transistor coupled between the PD and the FD is switched on and off under the control of a voltage pulse asserted to the TX gate terminal to enable this charge transfer. Due to an always-presented coupling capacitance between the TX gate terminal and the FD, the pulse signal asserted on the TX gate is always largely coupled to the FD. This is called TX feed-through. It ripples through a source follower (SF) transistor and a row select (RS) transistor to an output line, also called a bitline, of the pixel cell. Such a propagation of a large unwanted pulse is unavoidable and causes annoying FPN even for dark signals (which are signals caused by non-photo-generated, intrinsic electrons inside the pixel). For any given bitline, since it connects to all the pixels in the column, it possesses a significant amount of capacitive and resistive (RC) load. Therefore, any state changes on the bitline are unavoidably slow due to this RC delay. That is, once a status changes happen on the bitline, it takes a long time to settle to the newly updated step level. This is governed by the so-called RC time constant. For any given input step Vin, its settling time is governed by $$t_{settle} = \tau \cdot \ln\frac{V_{in}}{V_{0.5LSB}},$$

where time constant $\tau = RC$, and $V_{0.5LSB}$ is half the value of a single bit equivalent voltage.

One of the typical solutions to resolve this is to clamp the bitline voltage to limit its swing by using a clamp voltage generator. It helps suppressing the high-light-banding represented by voltages near its lower end. The goal is achieved by not allowing the bitline to drop below the clamped voltage limit. As a result, it reduces FPN under the high lighting conditions. However, this solution causes a large current variation to the power supply in react to each step voltage changes which in turn induces other unwanted performance issues on the sensor.

Another solution is to disconnect the pixel cell from its output line (bitline) during the charge transfer, also with the help of an added clamp voltage generator. The clamp voltage generator does not allow the bitline voltage to drop below a certain voltage level. Therefore, when the charge transfer takes place, the voltage change on bit lines can be reduced and settling time can be shortened. In addition, the total power supply (AVDD) current is maintained near constant by the clamp voltage generator to avoid large variations on the power supply. With this solution, after the RS transistor is switched back on again to reconnect the pixel output to the bitline, under complete dark condition which is correlated to the highest voltage, the bitline is charged by a pull-up-current through the SF transistor instead of being sunk by a pull-down-current of a relatively weak current source generator. Settling time is also reduced because the SF current is not limited by the current source generator. A faster pull up is always reached. That means, a faster settling on low lighting condition is clearly favored for this solution. Nevertheless, performance on strong lighting condition is still a problem, since higher contrasts in light intensities involve larger voltages drops on bitline which directly leads to a longer settling time.

What's more, as size of pixel gets smaller and with higher conversion gains utilized, the FD capacitance may get so small that the TX feed-through may easily go beyond the range of the analog-to-digital converter (ADC) input voltage.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
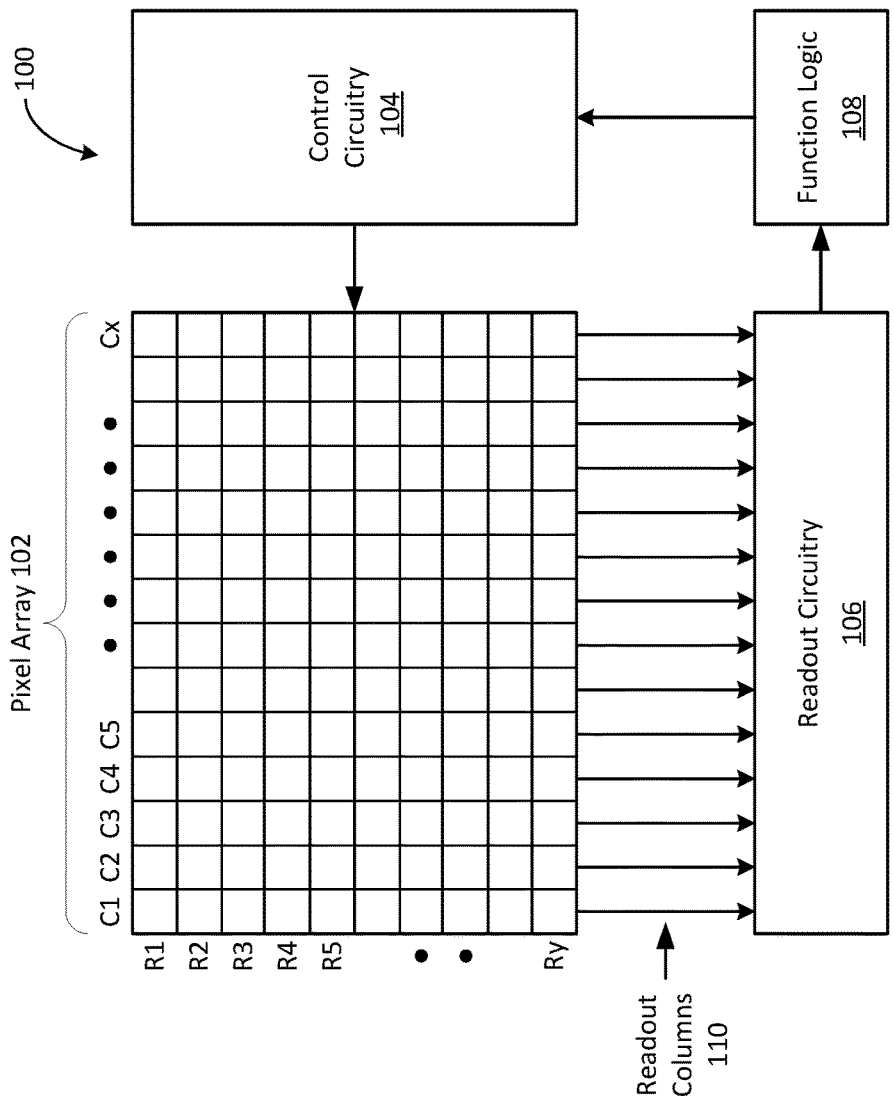
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus and method for a fast settling pixel output line in an imaging sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 104, readout circuitry 106, and function logic 108. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image charge through photo-generation of the image charge, corresponding image data is readout by readout circuitry 106 and then transferred to function logic 108. Readout circuitry 106 may be coupled to readout image data from the plurality of photodiodes in pixel array 102. In various examples, readout circuitry 106 may include amplification circuitry, analog-to-digital (ADC) conversion circuitry, or otherwise. In one example, readout circuitry 106 may readout a row of image data at a time along readout column lines 110 (illustrated) or may readout the image data using a variety of other techniques (not illustrated), such as a serial readout or a full parallel readout of all pixels simultaneously. Function logic 108 may store the image data or even manipulate the image data by applying post image effects (e.g., crop, rotate, remove red eye, adjust brightness, adjust contrast, or otherwise).

In some embodiments, function logic 108 may require certain imaging conditions to be met and may therefore instruct the control circuitry 104 to manipulate certain parameters in pixel array 102 to achieve better qualities or special effects.

Figure 2:
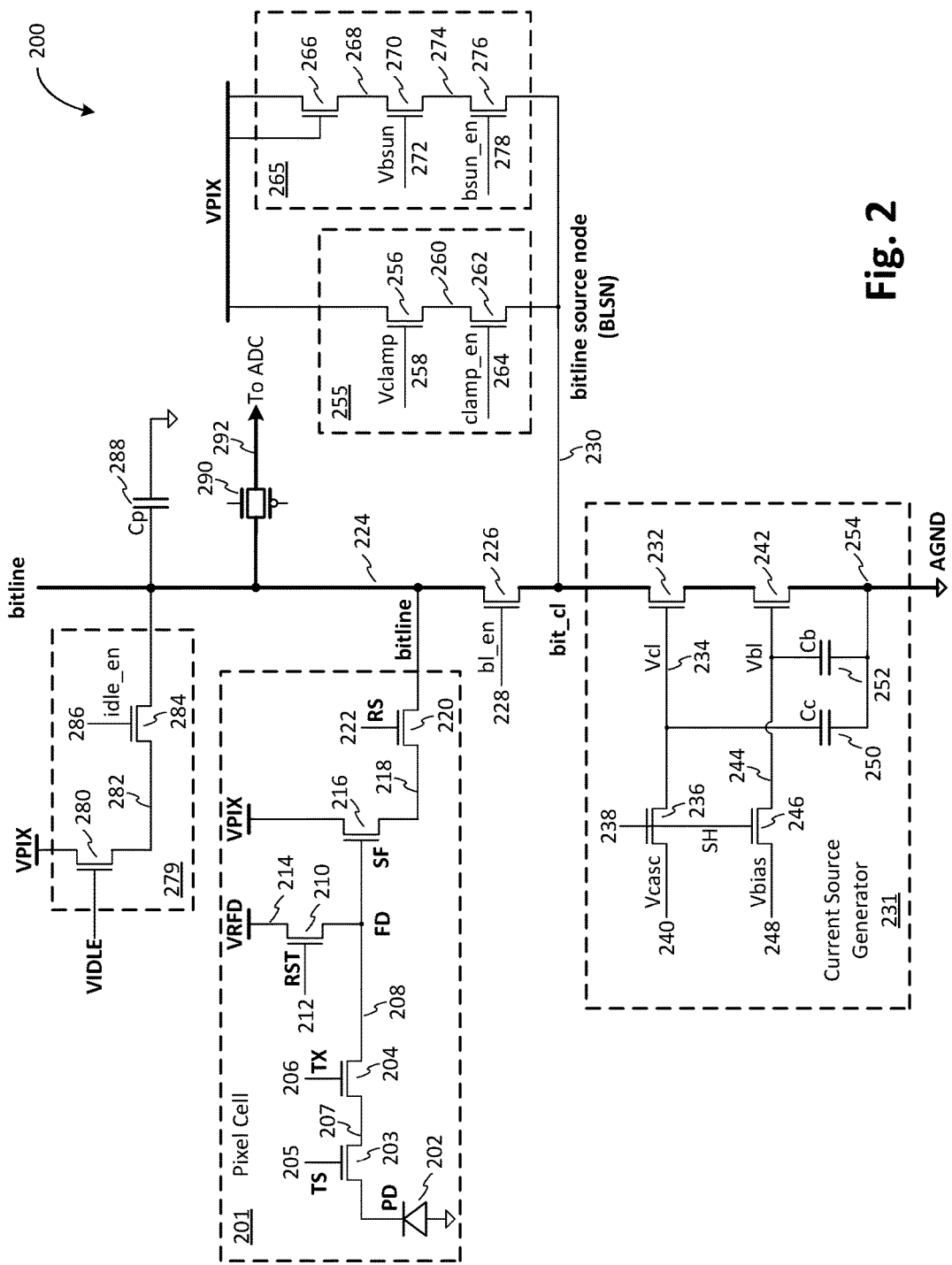
FIG. 2 is an example schematic of a block diagram of a pixel cell and pixel output circuit in an imaging sensor that is capable of fast settling in its bitline in accordance with an embodiment of the present disclosure.

FIG. 2 is one example of block diagram of a pixel cell and pixel output circuit in an imaging sensor that is capable of fast settling on its output line, bitline 224, in accordance with an embodiment of the present disclosure. The illustrated embodiment of image sensor system 200 may comprise a detecting photodiode (PD) 202 in a typical 4 transistor (4T) pixel cell 201, where the 4T portion may include a transfer (TX) transistor 204, a reset (RST) transistor 210, a source follower (SF) transistor 216, and a row select (RS) transistor 220. In one embodiment, the RS transistor 220 is connected between the source terminal of the SF transistor 216 and the bitline 224, the drain terminal of the SF transistor 216 is connected to a pixel voltage (VPIX) directly, as shown in FIG. 2. In another embodiment, the RS transistor 220 is connected between the drain terminal of the SF transistor 216 and the VPIX. The VPIX may be connected to a power supply voltage AVDD, or may be connected to a regulated voltage supply, where the regulated voltage supply is regulated based on the supply from the AVDD. The node where the drain of the TX transistor 204, the source of the RST transistor 210, and the gate of the SF transistor 216 meet is a floating diffusion (FD) 208. A reset (RST) gate voltage 212 and a RS gate voltage 222 which are under the control of the control circuitry 104 (see FIG. 1) enable conductions of the RST transistor 210 and the RS transistor 220, respectively.

The TX transistor 204 is enabled by a transfer (TX) gate voltage 206. The TX transistor 204 can be switched on when a high connect voltage is asserted to the TX gate voltage 206, under which, in one embodiment, the photodiode (PD) 202 is connected to the TX receiving terminal 207 of the TX transistor 204 directly, the photo-generated signal charges accumulated at the PD 202 can be transferred to the FD 208 through the TX transistor 204. In another embodiment, the stored charges presented at the TX receiving terminal 207 of the TX transistor 204 which are transferred by the transfer storage (TS) transistor 203 from the PD 202 may be transferred to the FD 208 through the TX transistor 204. The TX transistor 204 can be switched off when a low enough disconnect voltage is asserted to the TX gate voltage 206.

The amplified image signal from the source terminal of the SF transistor 216 is delivered to the bitline 224 when the RS transistor 220 is switched on when the RS gate voltage 222 is set to high. The analog image signal on the bitline 224 is eventually presented to an input terminal of an ADC. In one embodiment, such an ADC is one of the pluralities of ADCs coupled to each bitlines, or readout columns 110 as shown in FIG. 1, when a corresponding transmission gate 290 is enabled.

A bitline enable transistor 226 connects between the bitline 224 and a bitline source node (BLSN) 230. When a bitline enable voltage, bl_en 228, is set to high, the bitline enable transistor 226 is switched on, and the bitline 224 is connected to its current source (CS) generator 231 through the BLSN 230.

The CS generator 231 connects between the BLSN 230 and an analog ground (AGND). The CS generator 231, in an embodiment, provides adjustable current to the BLSN 230 by a bias transistor 242. The bias transistor 242 is controlled by a bias control voltage, Vbl 244. An appropriate bias control voltage Vbl 244 is need for normal operation of the bias transistor 242 in the CS generator 231. The Vbl 244 is conditioned by a voltage Vbias 248. The CS generator 231, in another embodiment, with the cascode transistor 232, the cascode enable transistor 236, the bias enable transistor 246, the CH capacitor 250, and the BH capacitor 252 all presented, provides adjustable current to the BLSN 230 by two serially connected transistors: a cascode transistor 232 and the bias transistor 242. The cascode transistor 232 is controlled by a cascode control voltage, Vcl 234. The bias transistor 242 is controlled by the bias control voltage, Vbl 244.

An appropriate cascode control voltage Vcl 234 is need for normal operation of the CS generator 231 and is conditioned by a voltage Vcasc 240 when the sample and hold (SH) voltage 238 is set to high to close a cascode enable transistor 236. When the SH voltage 238 is high, a cascode hold (CH) capacitor 250 is charged to Vcasc 240. The CH capacitor 250 holds the value of Vcasc 240 till the next SH pulse 238 comes and the value of Vcl 234 on the CH capacitor 250 is refreshed to the exact value of Vcasc 240 again at that point. Since the CH capacitor 250 is coupled between the cascode control voltage Vcl 234 and the analog ground AGND 254, Vcl 234 discharges slowly and its value drops a little before the subsequent SH pulse 238 arrives. Both Vcasc 240 and the SH pulses 238 are controlled by the control circuit 104.

An appropriate bias control voltage 244 is also need for normal operation of the CS generator 231 and is conditioned by a voltage Vbias 248 when the SH voltage 238 is set to high to close a bias enable transistor 246. When the SH voltage 238 is high, a bias hold (BH) capacitor 252 is charged to the Vbias 248. The BH capacitor 252 holds the value of Vbias 248 till the next SH pulse 238 comes and the value Vbl 244 on the BH capacitor 252 is refreshed to the exact value of Vbias 248 again at that point. Since the bias BH capacitor 252 is coupled between the bias control voltage Vbl 244 and AGND 254, Vbl 244 discharges slowly and its value drops a little before the subsequent SH pulse 238 arrives. Vbias 248 is controlled by the control circuit 104.

Regardless whether the bitline 224 is connected or disconnected from the BLSN 230 by the bitline enable (BE) transistor 226, the CS generator 231 is always directly connected to the BLSN 230 by two voltage sources: a clamp voltage (CV) generator 255 and a blacksun voltage (BV) generator 265. The CS generator 231 may be driven by one of the two voltage generators in one embodiment, or both in another embodiment.

The clamp voltage (CV) generator 255 comprises a clamp voltage transistor 256 and a clamp enable transistor 262. The clamp voltage transistor 256 receives the VPIX and provides an adjustable clamp voltage 260 under the control of a clamp control voltage 258. The clamp enable transistor 262, under the control of a clamp enable voltage 264, delivers the adjustable clamp voltage 260 to the CS generator 231 on the BLSN 230.

The blacksun voltage (BV) generator 265 comprises a blacksun supply transistor 266, a blacksun transistor 270 and a blacksun enable transistor 276. The blacksun supply transistor 266 provide a blacksun supply voltage 268 which is guaranteed to be lower than VPIX because the voltage drop between the drain and source terminals of the blacksun supply transistor 266. The blacksun voltage transistor 270 receives the blacksun supply voltage 268 and provides an adjustable blacksun voltage 274 under the control of a blacksun control voltage 272. A blacksun enable transistor 276, under the control of a blacksun enable voltage 278, delivers the adjustable blacksun voltage 274 to the current source generator 231 on the BLSN 230.

The adjustable blacksun voltage 274 provides a much higher potential than the adjustable clamp voltage 260 does on the BLSN 230. If VPIX, the highest potential of the pixel circuit, represents the darkest image boundary which the ADC sees as an upper limit of its converting range, and any normal background signals fall slightly below VPIX, then, the adjustable blacksun voltage 274 is set to be lower than the lowest voltage of those background signals. The blacksun voltage still represents a dark image, and only slightly less dark than those background signals. The purpose of the blacksun voltage generator 265 is explained in paragraph below.

The blacksun voltage is used to avoid the so-called sun eclipse effect (or blacksun effect). That is, when the image sensor is facing the sunlight directly, the supposedly "dark" background at the FD 208 is filled with a lot of electrons either generated directly on the FD (since the FD itself is a photo sensitive substance) or bloomed unstoppably from its surrounding silicone. As a result, this supposedly dark background noise signal is saved as an actual bright signal. After the real bright (plus noise) signal is saved, based on the correlated double sampling (CDS) method, after the ADC, a subtraction of the two saved almost equally "bright" signals induces to a near "zero" final signal, which is equivalent to a black image at the spot where the bright sun should be presented. As can be seen, if left as is, the bright sun becomes a black sun as a result of the subtraction mentioned above—therefore the term "the black sun". To overcome the black sun effect, the blacksun voltage 274 forces a black level when known background signal (black or near black) is taken during the CDS process. As a result, the sun in the image will no longer be black.

The blacksun control voltage 272 is controlled by the control circuitry 104 based on the feedback on where the level of normal background signals are presented. Once the lowest equivalent voltage (among many normal background signals) is determined by the function logic 108, that value is fed to the control circuitry 104. And then, an updated blacksun control voltage 272 is fed to the BV generator 265 to ensure that the background signals will be "black" enough for the CDS process.

The adjustable clamp voltage 260, in contrast to the adjustable blacksun voltage 274, sets a lowest limit voltage. It represents the brightest image boundary which the ADC sees at the lower end of its converting range.

The control circuit 104 provides all four control signals: the clamp control voltage 258, the clamp enable voltage 264, the blacksun control voltage 272, and the blacksun enable voltage 278, to control the CV generator 255 and the BV generator 265.

An idle voltage (IV) generator 279 serves as a current source to the bitline 224. This IV generator 279 is needed to maintain an idle potential to the bitline 224 when the bitline 224 is disconnected from its supplying circuits. In one embodiment, when both the RS transistor 220 and the bitline enable transistor 226 are disabled simultaneously, the IV generator 279 becomes the sole power source to charge the floating bitline 224 through its parasitic capacitor Cp 288. The idle potential is maintained at a closest value to that of the SF source terminal 218 when the gate of the SF 216 is set to a reset FD voltage (VRFD) by the RST transistor 210. The VRFD is a dedicated voltage to reset the floating diffusion controlled by the control circuitry 104. The VRFD may or may not have the same voltage of the VPIX. When the RS transistor 220 is switched on again, potential at the bitline 224 has been pre-charged to a similar level of the SF source terminal 218; therefore the settling time that the bitline 224 joins the SF 216 is much shortened. That is because when the bitline 224 is reconnected to the SF 216, the voltage difference between the bitline 224 and the SF output 218 is greatly reduced. In one embodiment, the IV generator 279 comprises an idle supply transistor 280 that receives VPIX and provides an idle supply voltage 282 controlled by an idle control voltage (VIDLE), and an idle enable transistor 284 that drives the bitline 224. An idle enable voltage 286 and the VIDLE are controlled by the control circuitry 104.

Figure 3:
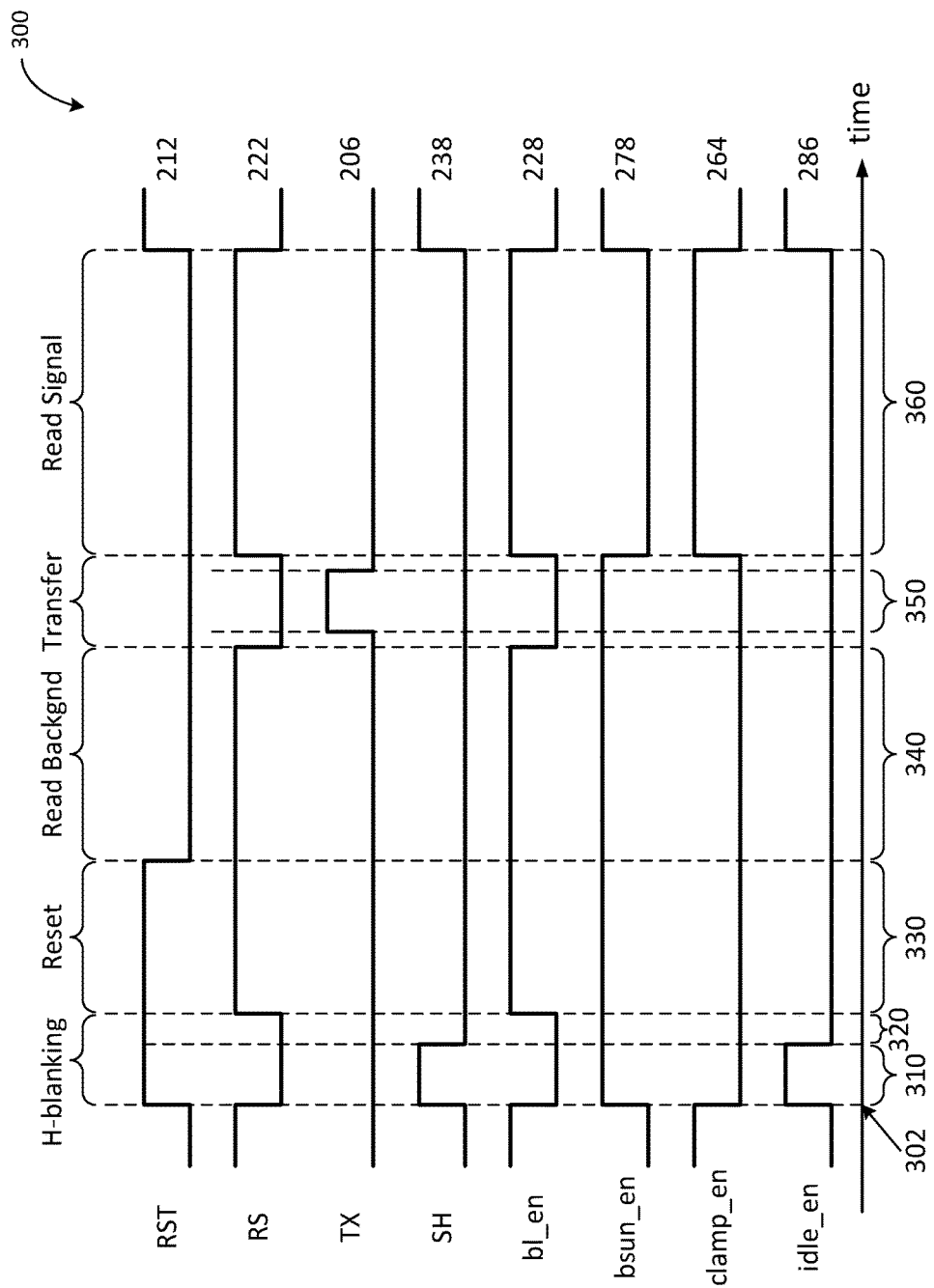
FIG. 3 is an example waveform in association with the operation of the photodiode in an imaging sensor in dealing with bitline settling in accordance with an embodiment of the present disclosure.

FIG. 3 is an illustrative signal readout operation 300 of a pixel cell and its output circuit in an imaging sensor that is capable of fast settling of its output line, the bitline 224, in accordance with an embodiment of the present disclosure. To better understand FIG. 3 and the sequence it represents, a timing flowchart is provided in FIG. 4 to explain all major events that take place in FIG. 3 in conjunction with FIG. 2.

Figure 4:
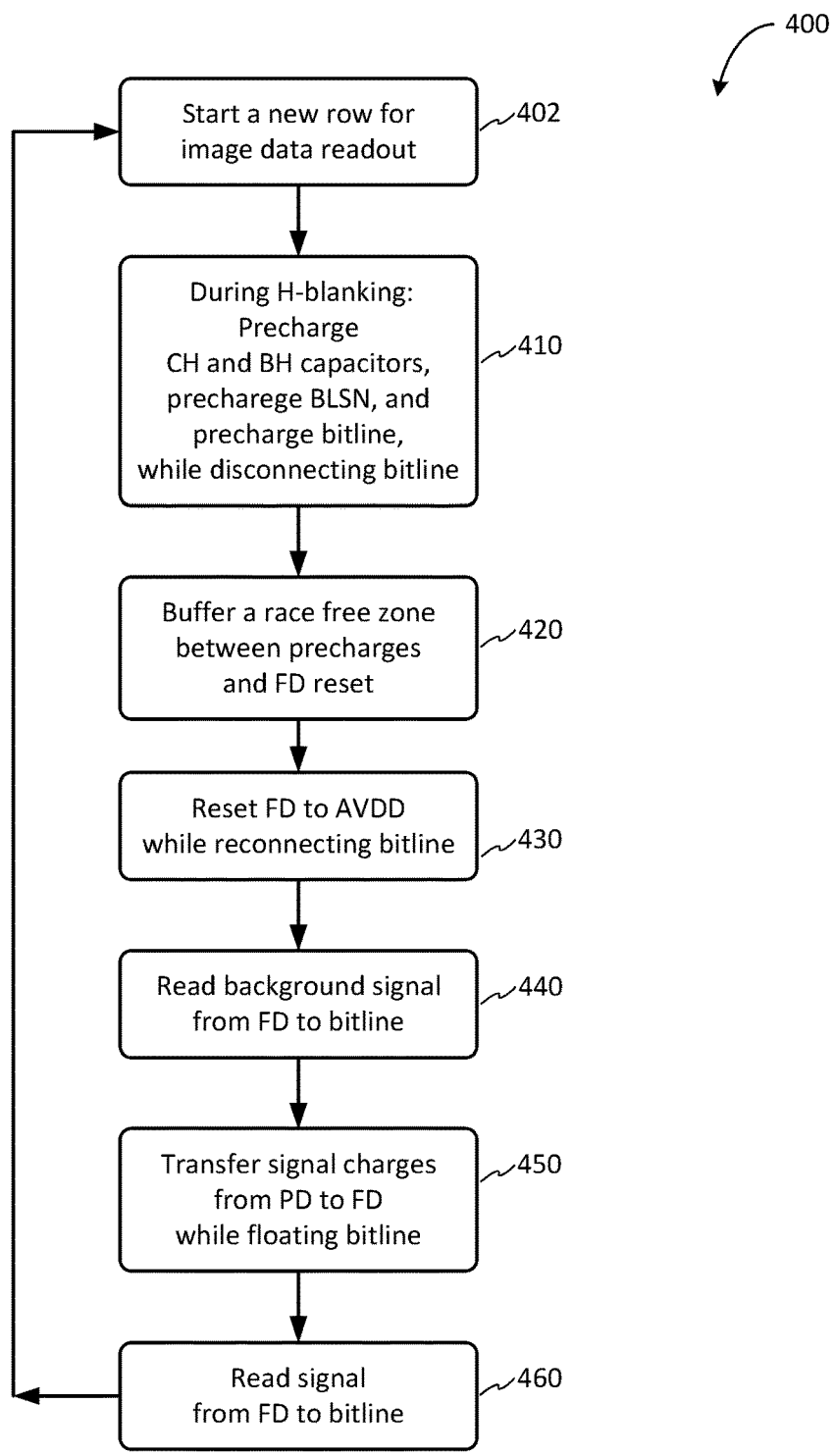
FIG. 4 is an illustrative flow chart in associate with the events of FIG. 3 in accordance with an embodiment of the present disclosure.

FIG. 4 is an illustrative flow chart 400 in accordance with an embodiment of the present disclosure. The flow chart 400 may illustrate a complete cycle of row readout and demonstrates how fast settling on the bitline 224 may be achieved in a typical data readout cycle using the disclosed circuitry 200.

The flow chart 400 begins at time 402 and followed by process block 410. Time 402 (correlated to time point 302 in FIG. 3) marks the beginning of a readout cycle where a new row of a plurality of pixel cells is being read out by the readout circuitry 106. Process block 410 is correlated to the time region 310 shown in FIG. 3. Process block 410 coincides with the Horizontal blanking (H-blanking) for each row of the pixel array 102. H-blanking clears each readout columns 110 of the entire concurrent row, prior to a new readout cycle. Circuit-condition-wise, during block 410, the RST transistor 210 is switched on by the RST gate voltage 212 to reset the FD 208 to the VRFD. Meanwhile, both the RS transistor 220 and the bitline enable resistor 226 are switched off by the RS gate voltage 222 and the bitline enable (bl_en) voltage 228 simultaneously. These switch-offs isolate the bitline 224 from the rest of the driving circuitries except for the IV generator 279 in an embodiment where the RS transistor 220 is connected between the SF transistor 216 and the bitline 224.

Three major pre-charging activities take effect simultaneously during the process block 410 which coincides with the subsequent H-blanking. Firstly, for the current source (CS) generator 231, if the cascode transistor 232, the cascode enable transistor 236, the bias enable transistor 246, the CH capacitor 250, and the BH capacitor 252 are all presented in one embodiment, both the cascode enable transistor 236 and the bias enable transistor 246 are enabled by the sample and hold (SH) voltage pulse 238. The CH capacitor 250 is charged to Vcasc 240, and the BH capacitor 252 is charged to Vbias 248. Inside block 410 when SH pulse is on, the cascode transistor 232 is driven by Vcl 234, which is driven by Vcasc 240 directly to operate properly; and the bias transistor 242 is driven by Vbl 244, which is driven by Vbias 248, either directly in one embodiment or through the bias enable transistor 246 in another embodiment, to operate properly. Outside of the block 410 when the SH pulse is off, the normal operation of the CS generator 231 between SH pulses is properly maintained by the CH capacitor 250 and the BH capacitor 252, because both bias values Vcl and Vbl that drive the cascode transistor 232 and the bias transistor 242 are properly held by these two capacitors.

Secondly, the clamp voltage (CV) generator 255 is disabled by setting the clamp enable voltage, clamp_en 264, to low. And the blacksun voltage (BV) generator 276 is enabled by setting the blacksun enable voltage, bsun_en 278, to high. The BLSN 230 is charged by the BV generator 265 through the CS generator 231 during this current process block 410.

Thirdly, the idle voltage (IV) generator 279 is enabled by setting the idle enable voltage, idle_en 286, to high. The isolated bitline 224 is charged by the IV generator 279 through the bitline parasitic capacitor Cp 288 to the idle potential that matches closely to the high voltage value appeared on the SF source potential 218, since the SF gate, or the FD 208, is set to the VRFD by the RST transistor 210 during this same period.

The IV generator 279 pulls the bitline 224 voltage up to its intended high reset level by using its full current capacity through the parasitic capacitor Cp 288 alone. This shortens the reset settling time of each row, therefore shortening the H-blanking time. As a direct consequence, the readout time for each row is reduced, as well as the overall frame time. Swapping the charging duty from the CV generator 255 to the IV generator 279 at time 302 helps to maintain a stable consumption of the supply power at AVDD, because the bitline 224, as a load circuit, is continuously charged by either the CV generator 255 or the IV generator 279.

The process block 410 may be followed by process block 420. Process block 420 is correlated to the time region 320 shown in FIG. 3. During block 420, both the SH voltage 238 and the idle enable voltage idle_en 228 are set from high to low. The cascode enable transistor 236, the bias enable transistor 246, and the idle enable transistor 284 are switched from on to off. The time duration of the time region 320 only needs to be long enough to buffer a zone between the first switch action of the SH voltage 238 along with the idle enable voltage idle_en 228 and the second switch action of the RS gate voltage 222 along with the bitline enable voltage bl_en 228, to avoid any race conditions between the first and the second switch actions. And to allow enough time, a few nanosecond, in one embodiment, is used for the bitline 224 to stabilize.

The process block 420 may be followed by process block 430. Process block 430 is correlated to the time region 330 of FIG. 3. During block 430, the RST gate voltage 212 remains high to keep the RST transistor 210 on. The FD 208 is continuously reset to the VRFD. Block 430 allows enough time for the bitline 224 to stabilize after the bitline 224 has been reconnected to the SF transistor 216 on one side and the BLSN 230 on the other when the RS transistor 220 and the bitline enable transistor 226 are both switched on.

The process block 430 may be followed by process block 440. Process block 440 is correlated to the time region 340 shown in FIG. 3. During block 440, the RST transistor 210 is turned off. A background signal on the FD 208 is amplified by the SF transistor 216 and then an amplified background signal is provided to the bitline 224 through the RS transistor 220 in one embodiment, or provided to the bitline 224 directly from the source terminal 218 of the SF transistor 216 in another embodiment. During this period, only the BV generator 265, among all three voltage generators, is enabled by the blacksun enable voltage 278. The blacksun voltage 274 drives both the BLSN 230 and the bitline 224 at the same time since the bitline enable transistor 226 is still closed by the bitline enable bl_en 228. The adjustable blacksun voltage from the BV generator 265 may provide a potential generally set on the high side which is only slightly lower than the normal background signals. If the VPIX represents the darkest image signal, then, the not-too-much lower blacksun voltage sets a dark enough image signal if not quite the darkest. Appearing to the ADC, if the VPIX represents the lowest value of the ADC outputs, then the blacksun voltage ensures a very low value at the ADC output that is not-too-much higher than the lowest value that the ADC converts within its range.

The process block 440 may be followed by process block 450. Process block 450 is correlated to the time region 350 shown in FIG. 3. During block 450, in one embodiment, photo-generated signal charges accumulated on the PD 202 are transferred to the FD 208 when the transfer transistor 204 is switched on by the TX gate voltage 206. In another embodiment, the stored charges at the TX receiving terminal 207 transferred by the transfer storage (TS) transistor 203 from the PD 202 is transferred to the FD 208. Both the RS transistor 220 and the bitline enable transistor 226 are switched off before the charge transfer and switched back on after the charge transfer. This is to ensure no overlaps between the high level of TX voltage 206 and the high levels of the RS gate voltage 222 and the bitline enable signal bl_en 228. Note also that the idle enable transistor 284 remains off, and the bitline 224 resides in a completely floating state when the transfer transistor 204 is toggled on and off during this current process block 450 in this disclosure.

The voltage variation of the bitline 224 caused by the toggling of the transfer gate voltage 206 is greatly reduced in comparing to the same case when the bitline 224 is not floated. The bitline 224 is able to maintain its original voltage level almost the same as the value prior to the pulse added to the TX gate 206. Voltage step may be more than 10 times smaller on the bitline 224 in comparison, in one example. The FPN is greatly reduced due to the floating status of the bitline 224 during the charge transfer caused by TX gate voltage 206. Although the bitline 224 is disconnected from the BV generator 265 during the charge transfer, the BV generator 265 still charges the BLSN 230 through the current source generator 231 to AGND. The total AVDD current shows little variation throughout this block 450. The system power, therefore, remains stable as demanded.

The process block 450 may be followed by process block 460. Process block 460 is correlated to the time region 360 shown in FIG. 3. During block 460, in general, the image charges transferred from the TX receiving terminal 207 to the FD 208 is amplified by the SF transistor 216 and then provided to the bitline 224 through the RS transistor 220 in one embodiment, or provided to the bitline 224 directly from the source terminal 218 of the SF transistor 216 in another embodiment. To be exact, right after the pulse on the TX gate 206 ends in block 450, the RS transistor 220 is reconnected by setting the RS gate voltage 222 to high to allow image signal voltage on the SF source terminal to drive the bitline 224, and the bitline enable transistor 226 is reconnected by setting the bitline enable bl_en 228 to high to allow the BLSN 230 to clamp the voltage on bitline 224.

During block 460, on the BLSN 230 side, the function of BV generator 265 is taken over by the CV generator 255. This swap takes effect by setting the blacksun enable voltage 278 to low and the clamp enable voltage 264 to high simultaneously. Since the adjustable clamp voltage is set much lower than the blacksun voltage, at the beginning of block 460, the voltage on the BLSN 230 starts to move downward from the high blacksun voltage. Meanwhile, on the SF source terminal side, if the image signal is dark, which is represented by a high voltage, the effective input step voltage on the bitline 224 is close to 0 at the switching point of the RS transistor, from off to on. The bitline 224 settles fast based on the small effective input step voltage. If the image signal is bright, the effective input step voltage on the bitline 224 is also minimized to favor a fast settling of the bitline 224, since the initial voltages on both sides of the bitline 224 intend to drift down simultaneously.

The adjustable clamp voltage of the CV generator 255 may provide a slightly higher potential than the level that represents the absolute brightest light. The clamp voltage sets a limit on the lowest boundary which is equivalent to the brightest signal that appears to the ADC. Although it is not the brightest but close enough so that the ADC may accept it as its input and converts it to serve as its highest value at the ADC output without overflow the ADC. The clamp voltage ensures a lower voltage limit that the ADC is able to handle. The CV generator 255 also serves to minimize the variation of the power consumption once it takes over the function of the BV generator 265 and continuously maintains stability of the total AVDD current.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A fast settling output line circuit, comprising:
   a photodiode (PD) adapted to accumulate image charges in response to incident light;
   at least one transfer (TX) transistor coupled between the PD and a floating diffusion (FD) to transfer the image charges from the PD to the floating diffusion (FD), wherein a transfer (TX) gate voltage controls the transmission of the image charges from a TX receiving terminal of the TX transistor to the FD;
   a reset (RST) transistor coupled to supply a reset FD voltage (VRFD) to the FD, wherein a reset (RST) gate voltage controls the RST transistor;
   a source follower (SF) transistor coupled to receive voltage of the FD from a SF gate terminal and provide an amplified signal to a SF source terminal;
   a bitline enable transistor coupled between a bitline and a bitline source node (BLSN), wherein a bitline enable voltage controls the bitline enable transistor, and wherein the BLSN is coupled to a blacksun voltage generator; and
   a current source generator coupled between the BLSN and a ground (AGND), wherein the current source generator provides adjustable current to the BLSN through a bias transistor controlled by a bias control voltage.

2. The fast settling output line circuit of claim 1, further comprising a transfer storage (TS) transistor coupled between the PD and the TX transistor to transfer the image charges accumulated in the PD to the TX receiving terminal of the TX transistor, wherein a transfer storage gate (TSG) voltage controls the transfer storage (TS) transistor.

3. The fast settling output line circuit of claim 1, further comprising a row select (RS) transistor coupled between the SF source terminal and the bitline, wherein a row select (RS) gate voltage controls the RS transistor, and wherein the RS transistor passes the amplified signal from the SF source terminal to the bitline.

4. The fast settling output line circuit of claim 1, further comprising a row select (RS) transistor coupled between the SF drain terminal and a pixel voltage (VPIX), wherein a row select (RS) gate voltage controls the RS transistor, wherein the RS transistor passes the VPIX to the SF drain terminal, and wherein the SF source terminal connects to the bitline.

5. The fast settling output line circuit of claim 4, wherein the VPIX connects to a supply voltage AVDD.

6. The fast settling output line circuit of claim 4, wherein the VPIX connects to a regulated voltage supply, wherein the regulated voltage supply is regulated based on the AVDD.

7. The fast settling output line circuit of claim 4, wherein the VPIX and the VRFD have the same value.

8. The fast settling output line circuit of claim 4, wherein the VPIX and the VRFD have different values.

9. The fast settling output line circuit of claim 1, wherein the blacksun voltage generator is configured to receive the VPIX and provide an adjustable blacksun voltage to the BLSN, and wherein the blacksun voltage generator comprises:
  a blacksun supply transistor receiving the VPIX and providing a blacksun supply voltage;
  a blacksun transistor coupled to receive the blacksun supply voltage and provide an adjustable blacksun voltage controlled by a blacksun control voltage; and
  a blacksun enable transistor coupled to pass the adjustable blacksun voltage to the BLSN controlled by a blacksun enable voltage.

10. The fast settling output line circuit of claim 9, further comprising a clamp voltage generator configured to connect to the BLSN.

11. The fast settling output line circuit of claim 10, wherein the clamp voltage generator is configured to receive the VPIX and provide an adjustable clamp voltage to the BLSN, and wherein the clamp voltage generator comprises:
  a clamp transistor configured to receive the VPIX and provide an adjustable clamp voltage controlled by a clamp control voltage; and
  a clamp enable transistor coupled to pass the adjustable clamp voltage to the BLSN controlled by a clamp enable voltage.

12. The fast settling output line circuit of claim 11, wherein the adjustable clamp voltage is lower than the adjustable blacksun voltage.

13. The fast settling output line circuit of claim 1, wherein a bias voltage provides the bias control voltage.

14. The fast settling output line circuit of claim 1, wherein the current source generator further comprises a cascode transistor coupled between the BLSN and the bias transistor controlled by a cascode control voltage.

15. The fast settling output line circuit of claim 14, wherein a cascode voltage provides the cascode control voltage.

16. The fast settling output line circuit of claim 14, wherein the current source generator further comprises:
  a cascode sample and hold (SH) transistor coupled to receive the cascode voltage and provide the cascode control voltage controlled by a sample and hold (SH) voltage;
  a bias sample and hold (SH) transistor coupled to receive the bias voltage and provide the bias control voltage controlled by the SH voltage;
  a cascode hold capacitor coupled between the cascode control voltage and the AGND; and
  a bias hold capacitor coupled between the bias control voltage and the AGND.

17. The fast settling output line circuit of claim 1, further comprising an idle voltage generator configured to receive the VPIX and provide an idle voltage to the bitline, wherein the idle voltage generator comprises:
  an idle supply transistor configured to receive the VPIX and provide an idle supply voltage controlled by an idle control voltage (VIDLE); and
  an idle enable transistor coupled to pass the idle supply voltage to the bitline controlled by an idle enable voltage.

18. The fast settling output line circuit of claim 1, further comprising a transmission gate passing the amplified signal from the bitline to an ADC input.

19. A method of fast settling an output line circuit, comprising:
  resetting a floating diffusion (FD) to a reset FD voltage (VRFD) by setting a reset (RST) gate voltage to high to switch on a reset (RST) transistor;
  precharging a bitline through a bitline parasitic capacitor to a SF source reset voltage by setting an idle enable voltage to high to turn on an idle enable transistor, when a row select (RS) transistor and a bitline enable transistor are switched off;
  precharging a bitline source node (BLSN) to a blacksun voltage by setting a blacksun enable voltage to high to turn on a blacksun enable transistor and by providing a blacksun control voltage to a blacksun transistor, and turning off a clamp enable transistor by setting a clamp enable voltage to low;
  discontinuing precharging to the bitline capacitor by setting the idle enable voltage to low to turn off the idle enable transistor;
  enabling a SF source terminal to the bitline and reconnecting the bitline to the BLSN by setting a RS gate voltage and a bitline enable voltage to high to close the RS transistor and the bitline enable transistor;
  disconnecting the FD from a pixel voltage (VPIX) by setting the RST gate voltage to low to switch off the RST transistor; and
  reading a background signal from the FD, wherein a SF transistor receives the background signal at a SF gate terminal and provides an amplified background signal at a SF source terminal, and wherein an ADC receives the amplified background signal from the bitline to an ADC input terminal.

20. The method of claim 19, wherein the RS transistor passes the amplified background signal to the bitline when the RS transistor is closed by the RS gate voltage.

21. The method of claim 19, wherein the amplified background signal flows to the bitline.

22. The method of claim 19 further comprising: precharging a cascode hold capacitor to a cascode voltage and a bias hold capacitor to a bias voltage by setting a sample and hold (SH) voltage to high to turn on a cascode SH transistor and a bias SH transistor; and discontinuing precharging the cascode hold capacitor and the bias hold capacitor by setting a sample and hold (SH) voltage to low to turn off the cascode SH transistor and the bias SH transistor when turning off the idle enable transistor.

23. The method of claim 19 further comprising transferring image charges accumulated from the TX receiving terminal of the TX transistor to the FD by switching a transfer (TX) transistor on and off with a toggle of a TX gate voltage after the RS transistor and the bitline enable transistor are open by setting the RS gate voltage and the bitline enable to low.

24. The method of claim 23, wherein after the TX transistor is switched off by setting the TX gate voltage to low, the RS transistor and the bitline enable transistor are closed by setting the RS gate voltage and the bitline enable to high, and the blacksun enable transistor is turned off by setting the blacksun enable to low, and the clamp enable transistor is turned on by setting the clamp enable to high.

25. The method of claim 24, wherein the SF transistor amplifies the image charges from the TX receiving terminal of the TX transistor to an amplified image signal at a SF source terminal, and wherein the ADC receives the amplified image signal from the bitline to the ADC input terminal.

26. The method of claim 25, wherein the RS transistor passes the amplified image signal to the bitline when the RS transistor is closed by the RS gate voltage.

27. The method of claim 25, wherein the amplified image signal flows to the bitline.

28. The method of claim 19, wherein a transmission gate passes the amplified image signal from the bitline to the ADC input terminal by enabling the transmission gate.

29. The method of claim 19, wherein a voltage provided by the blacksun enable transistor is higher than a voltage provided by the clamp enable transistor to the BLSN.

30. The method of claim 19, wherein the SF source reset voltage is a voltage value of the SF source terminal when the FD is reset though the RST transistor to VRFD.

31. An imaging system with a fast settling output line circuit, comprising:
- a pixel array of pixel cells, wherein each pixel cell includes:
  - a photodiode (PD) adapted to accumulate image charges in response to incident light;
  - at least one transfer (TX) transistor coupled between the PD and a floating diffusion (FD) to transfer the image charges from the PD to the floating diffusion (FD), wherein a transfer (TX) gate voltage controls the transmission of the image charges from a TX receiving terminal of the TX transistor to the FD;
  - a reset (RST) transistor coupled to supply a reset FD voltage (VRFD) to the FD, wherein a reset (RST) gate voltage controls the RST transistor; and
  - a source follower (SF) transistor coupled to receive voltage of the FD from a SF gate terminal and provide an amplified signal to a SF source terminal;
- a bitline enable transistor coupled between a bitline and a bitline source node (BLSN), wherein a bitline enable voltage controls the bitline enable transistor, and wherein the BLSN is coupled to a blacksun voltage generator;
- a current source generator coupled between the BLSN and a ground (AGND), wherein the current source generator provides adjustable current to the BLSN through a bias transistor controlled by a bias control voltage;
- a control circuitry coupled to the pixel array to control operation of the pixel array, wherein the control circuitry provides the TX gate voltage, the RST gate voltage, the RS gate voltage, the bitline enable voltage, a sample and hold (SH) voltage, a cascode voltage, a bias voltage, a clamp control voltage, a clamp enable voltage, a blacksun control voltage, a blacksun enable voltage, an idle control voltage (VIDLE), and an idle enable voltage to the pixel array;
- a readout circuitry coupled to the pixel array through a plurality of readout columns to readout image data from the plurality of pixels; and
- a function logic coupled to receive image data from the readout circuitry to store the image data from each one of the plurality of pixel cells, wherein the function logic provides instructions to the control circuitry.

32. The fast settling imaging system of claim 31, further comprising a transfer storage (TS) transistor coupled between the PD and the TX transistor to transfer the image charges accumulated in the PD to the TX receiving terminal of the TX transistor, wherein a transfer storage gate (TSG) voltage controls the TS transistor.

33. The fast settling imaging system of claim 31, further comprising a row select (RS) transistor coupled between the SF source terminal and the bitline, wherein a row select (RS) gate voltage controls the RS transistor, and wherein the RS transistor passes the amplified signal from the SF source terminal to the bitline.

34. The fast settling imaging system of claim 31, further comprising a row select (RS) transistor coupled between the SF drain terminal and a pixel voltage (VPIX), wherein a row select (RS) gate voltage controls the RS transistor, wherein the RS transistor passes the VPIX to the SF drain terminal, and wherein the SF source terminal connects to the bitline.

35. The fast settling imaging system of claim 34, wherein the VPIX connects to a supply voltage AVDD.

36. The fast settling imaging system of claim 34, wherein the VPIX connects to a regulated voltage supply, wherein the regulated voltage supply is regulated based on the AVDD.

37. The fast settling imaging system of claim 34, wherein the VPIX and the VRFD have the same value.

38. The fast settling imaging system of claim 34, wherein the VPIX and the VRFD have different values.

39. The fast settling imaging system of claim 35, further comprising a clamp voltage generator configured to connect to the bitline source node (BLSN).

40. The fast settling imaging system of claim 39, wherein the clamp voltage generator is configured to receive the VPIX and provide an adjustable clamp voltage to the BLSN, wherein the adjustable clamp voltage is lower than the adjustable blacksun voltage, and wherein the clamp voltage generator comprises:
- a clamp transistor configured to receive the VPIX and provide an adjustable clamp voltage controlled by a clamp control voltage; and
- a clamp enable transistor coupled to pass the adjustable clamp voltage to the BLSN controlled by a clamp enable voltage.

41. The fast settling imaging system of claim 31, wherein the blacksun voltage generator is configured to receive the VPIX and provide an adjustable blacksun voltage to the BLSN, and wherein the blacksun voltage generator comprises:
- a blacksun supply transistor configured to receive the VPIX and provide a blacksun supply voltage;
- a blacksun transistor coupled to receive the blacksun supply voltage and provide an adjustable blacksun voltage controlled by a blacksun control voltage; and
- a blacksun enable transistor coupled to pass the adjustable blacksun voltage to the BLSN controlled by a blacksun enable voltage.

42. The fast settling imaging system of claim 31, wherein a bias voltage provides the bias control voltage.

43. The fast settling imaging system of claim 31, wherein the current source generator further comprises a cascode transistor coupled between the BLSN and the bias transistor controlled by a cascode control voltage.

44. The fast settling imaging system of claim 43, wherein a cascode voltage provides the cascode control voltage.

45. The fast settling imaging system of claim 43, wherein the current source generator further comprises:
- a cascode sample and hold (SH) transistor coupled to receive the cascode voltage and provide the cascode control voltage controlled by the SH voltage;

a bias sample and hold (SH) transistor coupled to receive the bias voltage and provide the bias control voltage under the control of the SH voltage;

a cascode hold capacitor coupled between the cascode control voltage and the AGND; and a bias hold capacitor coupled between the bias control voltage and the AGND.

46. The fast settling imaging system of claim 31, further comprising an idle voltage generator configured to receive the VPIX and provide an idle voltage to the bitline, wherein the idle voltage generator comprises:

an idle supply transistor configured to receive the VPIX and provide an idle supply voltage controlled by an idle control voltage (VIDLE); and an idle enable transistor coupled to pass the idle supply voltage to the bitline controlled by an idle enable voltage.

47. The fast settling imaging system of claim 31, further comprising a transmission gate passing the amplified signal from the bitline to an ADC input.

* * * * *